(12) United States Patent
Aßmann et al.

(10) Patent No.: US 10,468,248 B2
(45) Date of Patent: Nov. 5, 2019

(54) METHOD FOR PRODUCING A SELF-ALIGNING MASKING LAYER

(71) Applicant: Infineon Technologies AG, Neubiberg (DE)

(72) Inventors: Heiko Aßmann, Dresden (DE); Felix Braun, Dresden (DE); Marcus Dankelmann, Wachau (DE); Stefan Doering, Dresden (DE); Karsten Friedrich, Moritzburg (DE); Udo Goetschkes, Dresden (DE); Andreas Greiner, Wachau (DE); Ralf Rudolf, Dresden (DE); Jens Schneider, Moritzburg (DE)

(73) Assignee: Infineon Technologies AG, Neubiberg (DE)

( * ) Notice: Subject to any disclaimer, the term of this patent is extended or adjusted under 35 U.S.C. 154(b) by 234 days.

(21) Appl. No.: 15/485,232

(22) Filed: Apr. 12, 2017

(65) Prior Publication Data

US 2017/0294299 A1 Oct. 12, 2017

(30) Foreign Application Priority Data

Apr. 12, 2016 (DE) .................. 10 2016 106 691

(51) Int. Cl.
| | |
|---|---|
| *H01L 21/02* | (2006.01) |
| *H01L 21/265* | (2006.01) |
| *H01L 21/027* | (2006.01) |
| *H01L 21/266* | (2006.01) |
| *H01L 21/268* | (2006.01) |
| *H01L 21/324* | (2006.01) |
| *H01L 29/06* | (2006.01) |

(52) U.S. Cl.
CPC ........ *H01L 21/027* (2013.01); *H01L 21/0271* (2013.01); *H01L 21/02381* (2013.01); *H01L 21/02532* (2013.01); *H01L 21/02634* (2013.01); *H01L 21/266* (2013.01); *H01L 21/268* (2013.01); *H01L 21/26513* (2013.01); *H01L 21/324* (2013.01); *H01L 29/0607* (2013.01)

(58) Field of Classification Search
USPC ....................................................... 438/478
See application file for complete search history.

(56) References Cited

U.S. PATENT DOCUMENTS

| | | | |
|---|---|---|---|
| 2003/0227047 A1 | 12/2003 | Hsu et al. | |
| 2006/0289933 A1 | 12/2006 | Gossner | |
| 2012/0147653 A1* | 6/2012 | Chung | H01L 27/101 365/103 |
| 2015/0194538 A1* | 7/2015 | Marino | H01L 29/94 327/530 |
| 2016/0268335 A1* | 9/2016 | Stevens | H01L 27/14887 |

FOREIGN PATENT DOCUMENTS

DE 102005022129 A1 11/2006

* cited by examiner

*Primary Examiner* — Timor Karimy
(74) *Attorney, Agent, or Firm* — Viering, Jentschura & Partner MBB

(57) ABSTRACT

In various embodiments, a method is provided. The method may include forming a buried electrically charged region at a predefined position in a first layer in such a way that the buried electrically charged region generates an electric field having a lateral inhomogeneous field distribution above the first layer, and forming a second layer above the first layer using the field distribution in such a way that a structure of the second layer correlates with the position of the buried electrically charged region.

16 Claims, 8 Drawing Sheets

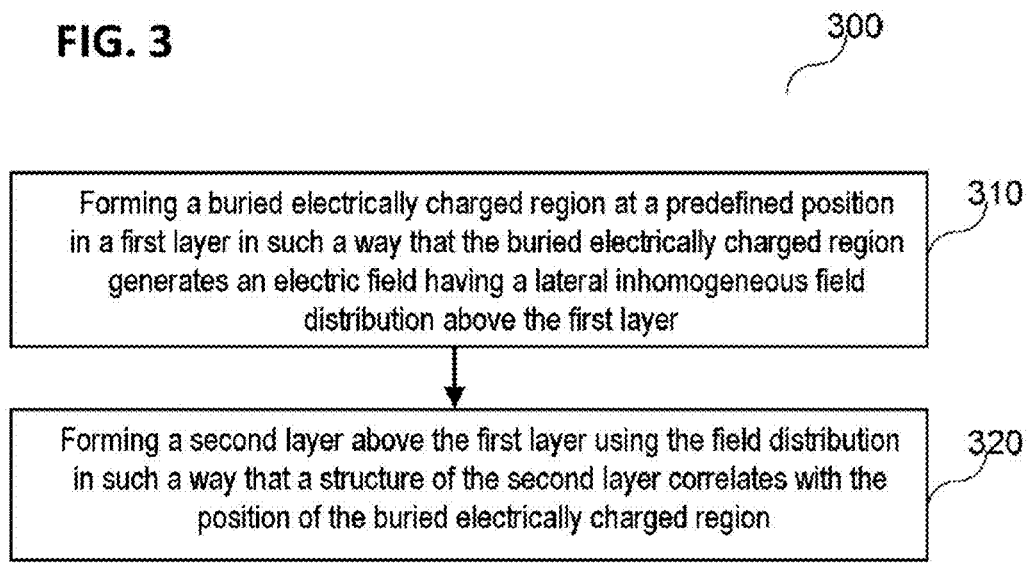
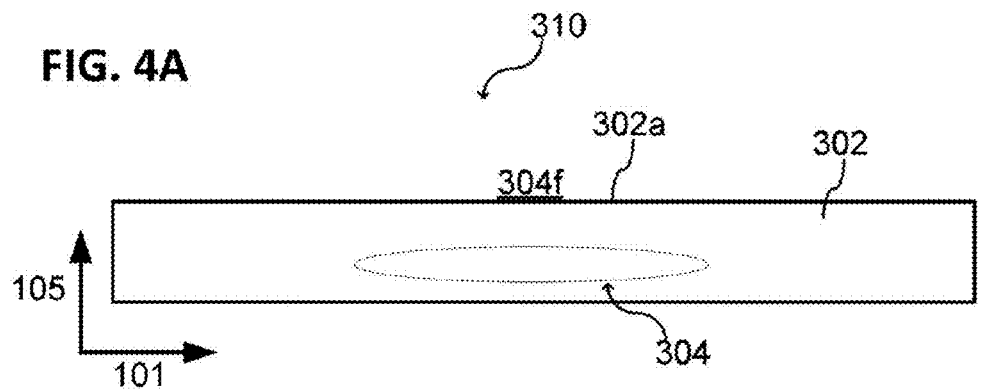
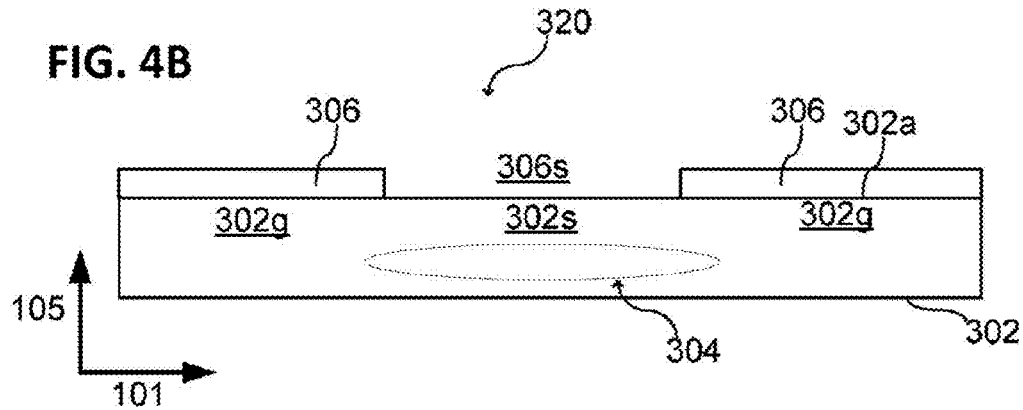

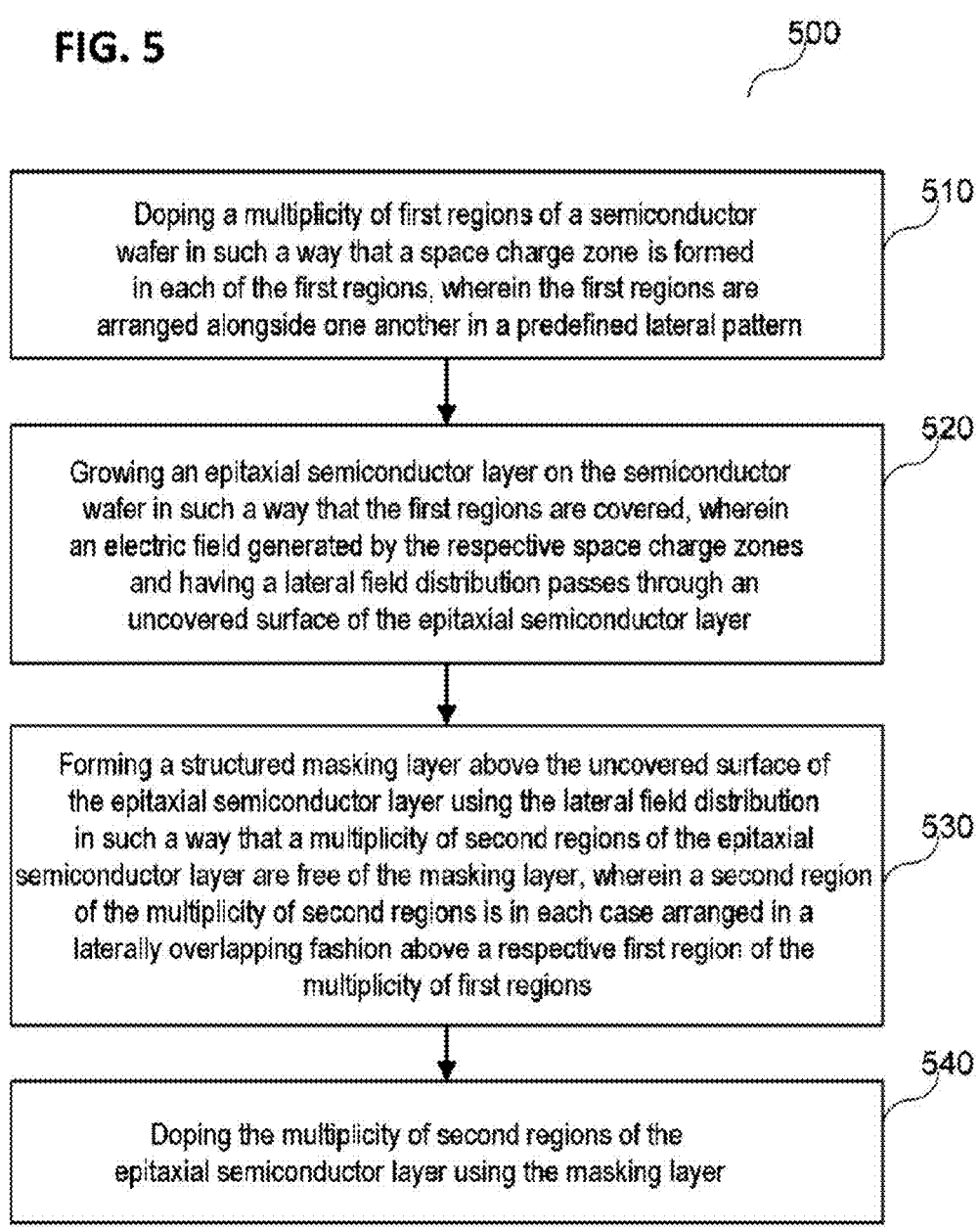

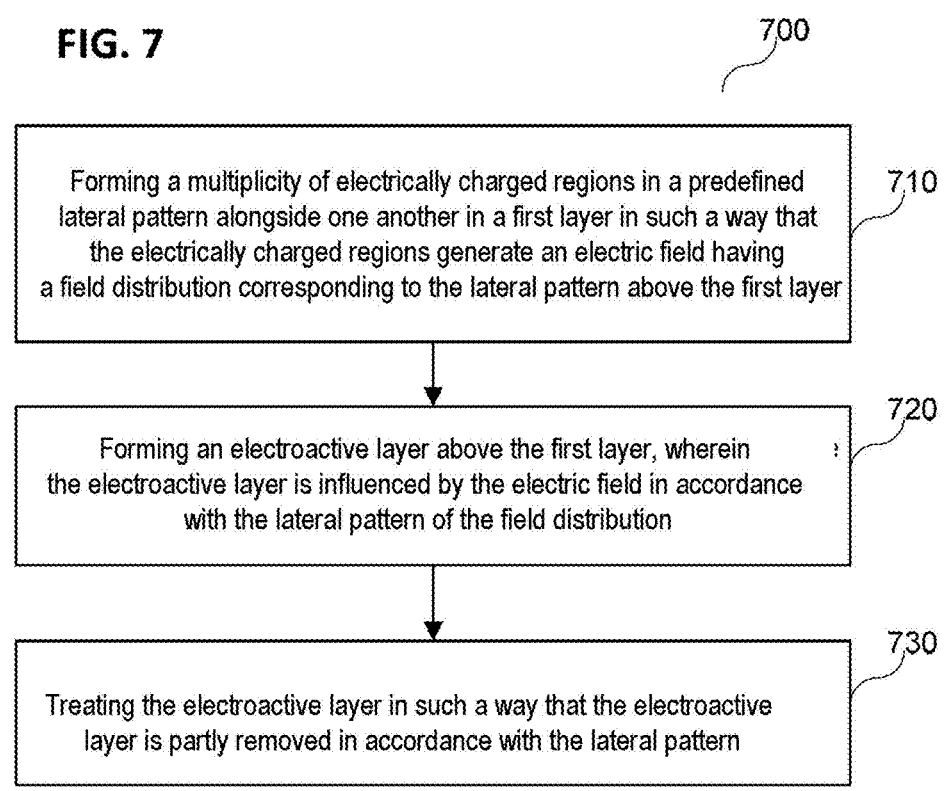

METHOD FOR PRODUCING A SELF-ALIGNING MASKING LAYER

CROSS-REFERENCE TO RELATED APPLICATION

This application claims priority to German Patent Application Serial No. 10 2016 106 691.5, which was filed Apr. 12, 2016, and is incorporated herein by reference in its entirety.

TECHNICAL FIELD

Various embodiments relate generally to a method for producing a self-aligning masking layer and a method for processing a layer.

BACKGROUND

In the semiconductor industry, local dopings are conventionally formed in a layer by a doping material being introduced into the layer either by means of diffusion or by means of ion implantation. In order to produce a local doping or a doping pattern in a layer, photolithographic processes are conventionally used. In this case, a structured photoresist layer as masking layer is produced on a layer to be doped and the layer is subsequently doped locally by means of the masking layer. A structured photoresist layer is usually referred to as soft mask and produced for example by a photoresist layer being partly exposed and then partly removed in accordance with the exposure. Consequently, a layer can be partly masked by means of the structured photoresist layer that then remains. Such photolithographic processes are known in a multiplicity of different modifications. Moreover, a structured photoresist layer can be used to structure an underlying further layer, e.g. by means of etching, such that the further layer can be used as a so-called hard mask.

By means of a masking layer, it is thus possible, for example, for an underlying layer to be doped locally or treated locally in some other way. In this case, the masking layer is conventionally aligned relative to an underlying layer to be masked (referred to as alignment), e.g. by means of a so-called alignment sequence before a respective exposure, wherein for example optically visible structures in the layer are used for the alignment. In the case of a layer stack to be processed, therefore, a plurality of alignment steps are necessary in order photolithographically to produce structured masks in each case.

In semiconductor technology it may be necessary, for example, to carry out a plurality of fabrication steps (e.g. structurings, coatings, dopings, etc.) successively, e.g. in a plurality of photolithographic planes or by means of a plurality of photolithographic steps that are performed successively on the same area. In this case, the overlay accuracy of structures (e.g. dopings, electrical contacts, etc.) of successively performed process steps (e.g. the overlay accuracy of a plurality of photolithographic patterns) may be relevant to the semiconductor structure produced overall. The overlay or positioning accuracy (also referred to as overlay error) in interaction with the critical dimension (CD) limits the process window in which a semiconductor structure can be produced in a reliably functioning fashion.

SUMMARY

In various embodiments, a method is provided. The method may include forming a buried electrically charged region at a predefined position in a first layer in such a way that the buried electrically charged region generates an electric field having a lateral inhomogeneous field distribution above the first layer, and forming a second layer above the first layer using the field distribution in such a way that a structure of the second layer correlates with the position of the buried electrically charged region.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 3 shows a schematic flow diagram of a method for processing a layer, in accordance with various embodiments;

FIGS. 4A and 4B in each case show a schematic illustration of a layer during different process steps of a method for processing the layer, in accordance with various embodiments;

FIG. 5 shows a schematic flow diagram of a method for processing a semiconductor wafer, in accordance with various embodiments;

FIG. 7 shows a schematic flow diagram of a method for processing a layer, in accordance with various embodiments;

DESCRIPTION

Figure 1:
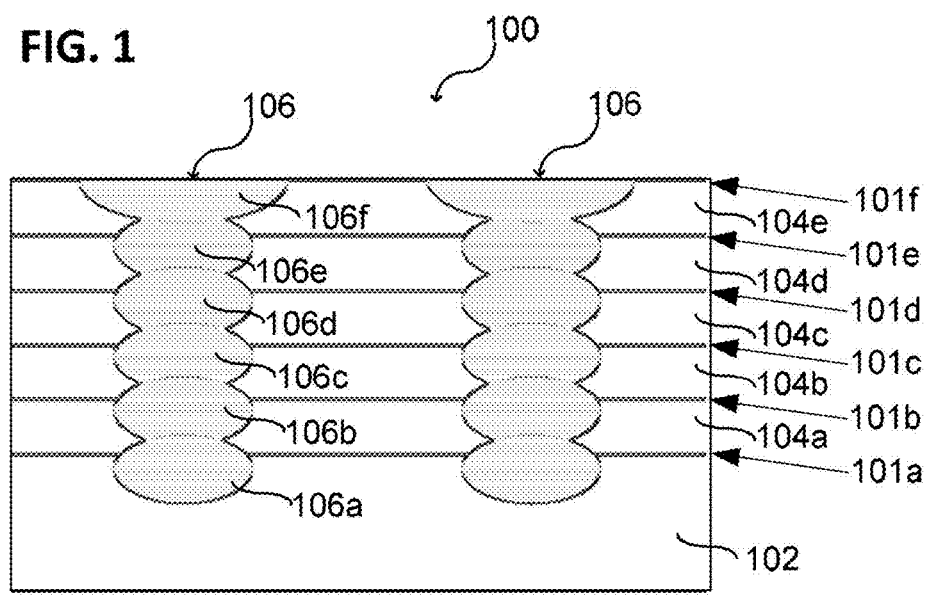
FIG. 1 shows a schematic illustration of a layer structure of a semiconductor power component.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since components of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various exemplary embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, in so far as this is expedient.

In general, structures situated above a buried doping region can be produced by means of photolithography. In this case, the alignment of the structures above the buried doping region can be difficult since the buried doping regions are for example not visible on the uncovered surface sufficiently to align further photolithographic processes in relation thereto.

In accordance with various embodiments, a method is provided which makes it possible to produce a structured masking layer that is self-aligning relative to a support (so-called self-alignment of the masking layer). This can be used, for example, to produce local modifications in a layer, without an alignment step having to be carried out. By way of example, coating, etching, doping, etc. are considered as local modifications.

In accordance with various embodiments, a method is provided which makes it possible to structure a layer without using a photolithographic process, i.e. for example without using an imaging exposure process. Such a layer can be used for example as a masking layer. Furthermore, such a layer can itself be a functional constituent of an electronic structure, e.g. the structured layer can be a structured polymer layer which can perform at least one function in an electrical polymer structure (for example a polymer transistor).

This is achieved for example by virtue of the fact that at least one electrically charged region which generates an electric field is produced in a layer, and that an electroactive material is used as masking layer or auxiliary layer for producing a masking layer. By way of example, the electroactive material can be influenced locally by virtue of the fact that it reacts to the electric field generated by the electrically charged region provided in the layer, such that the chemical or physical properties of the electroactive material correspondingly vary locally. An electroactive material can react for example to the electric field (referred to as electric field sensitive or electroactive) that is generated by the at least one electrically charged region. In this case, the at least one electrically charged region can also be buried in the substrate, wherein it must be ensured that the electric field can emerge from the layer (e.g. the at least one electrically charged region can be covered only by electrically insulating material and/or semiconducting material) in order to influence the electroactive material locally by means of the electric field.

Alternatively, the electric field can also be measured in a first step and, in a second step, a masking layer can be deposited only locally on the underlying layer to be masked. By way of example, the deposition process for the masking layer (or else alternatively for a functional layer) can be influenced locally on the basis of the measured electric field, e.g. by means of a laser.

By means of the methods described herein, firstly, the number of complex photolithographic steps or alignment steps can be reduced. Secondly, overlay errors, e.g. asymmetrical overlay errors, can also be reduced or avoided on account of the self-alignment.

In accordance with various embodiments, a method may include the following: forming a buried electrically charged region at a predefined position in a first layer in such a way that the buried electrically charged region generates an electric field having a lateral inhomogeneous field distribution above the first layer; and forming a second layer above the first layer using the field distribution in such a way that a structure of the second layer correlates with the position of the buried electrically charged region.

Furthermore, the first layer may include an electrically insulating material or consist thereof. In various embodiments, no electrically conductive, e.g. no metallic, layer can be arranged between the second layer and the first layer if it would shield the electric field. A highly doped semiconductor layer can also have the electrical properties of a metallic layer.

Consequently, the first layer may include an electrically semiconducting material or consist thereof. The electrically semiconducting material can be for example only weakly doped (e.g. with a doping concentration of less than $10^{\circ}$ 20 cm-3) or undoped. Illustratively, the first layer can be electrically insulating or electrically semiconducting.

In accordance with various embodiments, forming the buried electrically charged region may include doping the first layer. The buried electrically charged region can thus be a doped region of the first layer.

In accordance with various embodiments, forming the buried electrically charged region may include forming a space charge zone. The space charge zone can for example define the buried electrically charged region. Illustratively, the electrically charged region can be provided by means of a space charge zone.

The space charge zone is formed by means of two adjacent, differently doped semiconductor materials, i.e. by means of an n- and a p-doped semiconductor region, such that at least one p-n junction arises. An excess of negatively charged electrons is present in the n-doped region of the p-n junction, and an excess of positively charged holes is present in the p-doped region of the p-n junction. On account of the concentration gradient of charge carriers in the junction region between the n- and p-doped regions, a diffusion of charge carriers occurs, wherein electrons from the n-doped region pass into the p-doped region and recombine, and holes from the p-doped region pass into the n-doped region and recombine. Therefore, in the junction region, an excess of negative space charge is generated in the p-type semiconductor, and an excess of positive space charge in the n-type semiconductor. The space charge zone thus formed is depleted on account of the recombination of free (mobile) charge carriers. As described herein, the electric field of a space charge zone or of a doped region can be utilized in order to produce a structured layer that is self-aligning at the electric field.

In accordance with various embodiments, the method may furthermore include: irradiating at least the first layer with electromagnetic radiation (e.g. with light, UV light, etc.). On account of the irradiation, electron-hole pairs can be generated in the p-n junction of the first layer, said pairs being separated from one another in each case in the space charge zone. Consequently, electric field generated by the p-n junction can be influenced (e.g. increased).

In accordance with various embodiments, the method may furthermore include: heating at least the first layer. By way of example, this can be carried out from the rear side by means of a heatable holder. Furthermore, this can be carried out by means of a radiant heater. Since the diffusion processes in the p-n junction are temperature-dependent, the size of the space charge zone varies on account of a temperature change. Consequently, electric field generated by the p-n junction can be influenced (e.g. increased).

In accordance with various embodiments, the method may furthermore include: applying an electrical voltage at least to the first layer. In this case, the electrical voltage is applied in the reverse direction, i.e. relative to the n-doped region a negative voltage is applied to the p-doped region. Consequently, the electric field strength is amplified in the region of the space charge zone, which leads to an increased drift current. The space charge zone becomes larger, for example. Consequently, electric field generated by the p-n junction can be influenced (e.g. increased).

Generally, the p-n junction or the space charge zone can be influenced in such a way that the field strength of the electric field generated by the p-n junction is increased. Consequently, the field strength can also be adapted to an activation threshold of an electroactive layer.

In accordance with various embodiments, forming the buried electrically charged region may include forming the electrically charged region at a surface of a substrate (i.e. of any suitable support, e.g. a wafer or an epitaxial layer) and subsequently applying (e.g. growing) a cover layer on the surface of the substrate in order to bury the electrically charged region.

In accordance with various embodiments, the substrate can be a silicon wafer. In this case, the cover layer can be an epitaxial silicon layer. In accordance with various embodiments, the first layer may include silicon or consist thereof.

By way of example, the first layer can be a wafer or part (e.g. an epitaxial layer) of a wafer. Furthermore, the first layer can be provided on a wafer or any other support. The first layer can be for example a silicon layer, a silicon wafer or a surface region of a silicon wafer.

Furthermore, the second layer may include an electroactive material (also referred to as electrosensitive material), e.g. an electroactive polymer, or consist thereof. The electroactive material can be influenced for example by the electric field of the buried electrically charged region (e.g. laterally inhomogeneously).

In accordance with various embodiments, forming the second layer may include applying dielectric particles in a structured fashion, wherein the dielectric particles partly (e.g. laterally inhomogeneously) adhere to the first layer on account of the electric field.

The first layer can for example also be a layer stack, i.e. the first layer may include a plurality of layers.

In accordance with various embodiments, forming the second layer may include the following: determining the (e.g. laterally inhomogeneous) field distribution of the electric field; and forming the second layer using the information determined about the field distribution.

Furthermore, forming the second layer can be carried out by means of laser-assisted deposition (LAD) using the field distribution determined. Furthermore, forming the second layer can be carried out by means of an electrosensitive precursor in a chemical vapor deposition using the field distribution determined.

Furthermore, forming the second layer can be carried out in such a way that the latter masks the first layer, wherein a region of the first layer in a laterally overlapping fashion above the buried electrically charged region is free of the second layer. Illustratively, an (e.g. structured) masking layer can be formed which leaves free or masks to a lesser extent the buried electrically charged region or the region directly above the buried electrically charged region.

Furthermore, the method may include the following: doping that region of the first layer which lies directly above the buried electrically charged region by means of the second layer as masking layer.

Furthermore, the method may include the following: forming a masking layer by means of the second layer in such a way that the masking layer masks the first layer, wherein a region of the first layer in a laterally overlapping fashion above the buried electrically charged region is free of the masking layer.

In accordance with various embodiments, the layer can define a sideways (i.e. lateral) direction. In the case of wafer-based processes, this direction can run parallel to the main processing surface of the wafer. The term above, as used herein, relates in this case to a direction perpendicular to the lateral direction (i.e. perpendicular to the main processing surface of the wafer).

Furthermore, the method may include the following: doping that region of the first layer which lies directly above the buried electrically charged region by means of the masking layer.

The term in a laterally overlapping fashion also relates to the relative arrangement of a plurality of structures on a wafer or any other suitable support, wherein the direction considered is perpendicular to the main processing surface of the wafer and wherein the plurality of structures at least partly overlap one another with respect to this direction.

In accordance with various embodiments, a method may include the following: doping a multiplicity of first regions of a semiconductor wafer in such a way that a space charge zone is formed in each of the first regions, wherein the first regions are arranged alongside one another in a predefined lateral pattern; growing (or applying) a (e.g. epitaxial) semiconductor layer on the semiconductor wafer in such a way that the first regions are covered by the semiconductor layer, wherein an electric field having a lateral field distribution, said electric field being generated by the respective space charge zones, passes through an uncovered surface of the semiconductor layer; forming a structured masking layer above the uncovered surface of the semiconductor layer using the lateral field distribution in such a way that a multiplicity of second regions of the semiconductor layer are free of the masking layer, wherein a second region of the multiplicity of second regions is in each case arranged (e.g. in a laterally overlapping fashion or directly) above a respective first region of the multiplicity of first regions; and doping the multiplicity of second regions of the semiconductor layer using the masking layer.

In accordance with various embodiments, the semiconductor wafer can be a silicon wafer. In this case, the semiconductor layer can be an epitaxial silicon layer.

Furthermore, forming the structured masking layer can be carried out using an electroactive material, e.g. an electroactive polymer. Furthermore, forming the structured masking layer can be carried out using a material based on dielectric particles or molecules, e.g. using a dielectric polymer.

In accordance with various embodiments, a method for producing a self-aligning masking layer may include the following: forming a multiplicity of electrically charged regions in a predefined lateral pattern alongside one another in a first layer in such a way that the electrically charged regions generate an electric field having a field distribution corresponding to the lateral pattern above the first layer, forming an electroactive layer above the first layer, wherein the electroactive layer is influenced by the electric field in accordance with the lateral pattern of the field distribution;

and treating the electroactive layer in such a way that the electroactive layer is partly removed in accordance with the lateral pattern.

FIG. 1 schematically illustrates by way of example a structuring of a buried doping during the production of power components (e.g. using CoolMOS™ technology). In this case, a plurality of implantation resist masks are used for implanting columnar doping regions 106. By way of example, in a silicon wafer 102 or in a base epitaxial layer 102, a first region 106a can be doped by means of ion implantation. For this purpose, a first photolithographically structured resist mask is used, which can be provided in a first lithography plane 101a. After removing the first photolithographically structured resist mask, a first epitaxial layer 104a (i.e. an epitaxial silicon layer 104a) is grown on the silicon wafer 102. Afterward, by means of a second photolithographically structured resist mask, which can be provided in a second lithography plane 101b, a second region 106b (in the first epitaxial layer 104a) is doped by means of ion implantation. By repeating these steps, it is possible to produce a columnar doping region 106 made from a plurality of doping regions 106a-106e (or also with the doping region 106f) layer by layer, wherein the doping regions 106a-106e are buried in each case successively under an associated epitaxial layer 104a-104e. Overall, a plurality of photolithographically structured resist masks are used, which are provided in each case in an associated lithography plane 101a-101f. Consequently, by way of example, it is possible to produce doping regions that are deeper than can be achieved by means of one doping process alone.

The quality of the columnar doping regions 106 or of the electronic power component 100 may be dependent for example on the overlay or positioning accuracy of the resist masks relative to one another. Illustratively, the latter should be arranged as far as possible congruently one above another, such that no lateral offset of the respective doping regions 106a-106e relative to one another arises. The photolithographic structurings in the respective lithography planes 101a-101f may require different steps and be complex in terms of process engineering; by way of example, overlay alignments and dose regulations may be necessary. The epitaxial layers 104a-104e can have a thickness of up to a plurality of micrometers.

Overall, in the case of such processing, the lithographic structuring necessary for each new plane with the respective overlay alignments and CD adaptations (critical dimension, CD) has proved to be complicated.

Particularly in the production of power components, such as CoolMOS™ components, for example, the requirements made of the CD fidelity and the error-susceptible alignment with the alignment marks situated below the respective epitaxial layer should be emphasized.

The same analogously applies to other structurings and/or implantations which are produced in a plurality of lithography planes or by a plurality of successive lithography processes.

Various embodiments are based, for example, on the use of a buried doping region, whose effects (e.g. whose electric field of the space charge zone SCZ) through an applied epitaxial layer bring about a self-assembly of a material for a masking for a subsequent process step, for example an implantation.

Alternatively, a self-assembly of an auxiliary material used for the structuring can be used for a masking for the subsequent process step, for example for an implantation.

The advantages of this method are, for example, that conventional lithography is no longer required starting from the second plane for the structuring. Moreover, the structures starting from the second plane have an almost perfect overlay since imaging aberrations are not manifested here. This obviates the need for the following process constituents necessary heretofore:

lithography masks are no longer required, which leads to a saving of mask costs;

wafer alignment is no longer required, as a result of which a plurality of etching steps serving solely for the alignment mark etch are omitted. This leads to a saving of process steps;

an exposer is no longer required, which leads to a saving of tool costs;

specifically for overlay-critical planes, the process window is no longer limited by the properties of the exposer.

In accordance with various embodiments, it has been recognized that a self-alignment of a material used for structuring or of an auxiliary material at buried doping regions is possible.

By means of the method described herein, it is possible, for example, for a plurality of successive lithography planes based on one another, as is illustrated by way of example in FIG. 1, for the production of doping profiles, to be greatly simplified in terms of process engineering. In this regard, it is possible, for example, for the alignment and also the exposure by means of a lithographic mask that has to be produced separately to be completely replaced by use of self-assembling resist materials or necessary auxiliary layers which are aligned for example in relation to the electric field of the space charge zone. A structuring exposure of the wafer is no longer necessary. The structure transfer takes place in a self-aligning manner. For this reason, there are also no overlay errors induced by imaging aberrations and/or alignment inaccuracies.

Figure 2:
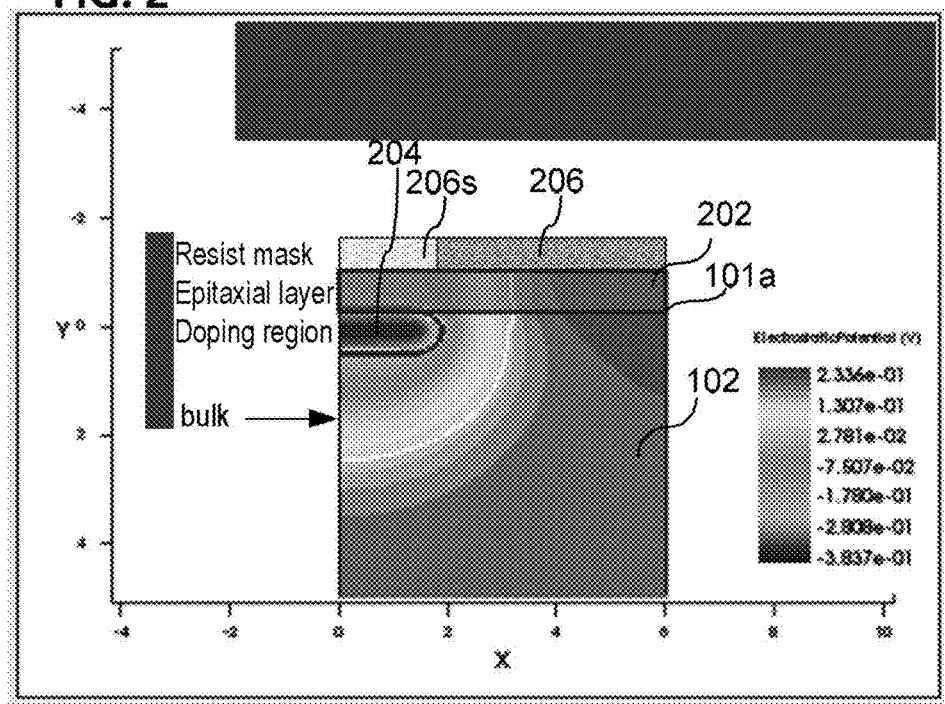
FIG. 2 shows a simulation result with regard to a profile of the electrical potential lines proceeding from a doping region in a semiconductor substrate, in accordance with various embodiments.

FIG. 2 shows, on the basis of a simulation result, the profile of the electrical potential lines (color-coded) through the subsequently applied epitaxial layer 202. In accordance with the orders of magnitude that are customary in the production of electronic components, the simulation used as doping of the doping region 204 (cf. the doping regions 106a-106e from FIG. 1) $Na=1.00E+17/cm^3$ and as the doping of the epitaxial layer 202 and of the bulk material 102 $Nd=1.00E+14/cm^3$.

An electroactive material 206 applied on the surface of the epitaxial layer 202, which electroactive material reacts to a predefined electrical potential, undergoes self-assembly on the basis of the electric field lines analogously to the source of the potential lines. In other words, the electroactive material 206 undergoes self-assembly on the basis of the buried doping region 204. As a result, a self-alignment of the resist mask 206 itself, or analogously of an auxiliary layer 206 required for the structuring of the resist mask, with respect to the doping plane 101a already present is provided. The size of the structures 206s to be produced is also oriented toward the potential profile present. The width of the space charge zone around the buried electrical region 204 (i.e. the lateral extent of said space charge zone along the x-direction) and thus the profile of the electrical potential lines can additionally be influenced by the temperature and a possible whole-area illumination, which is suitable as an additional parameter having an influence on the structure size. Consequently, by way of example, by means of temperature and/or a simple whole-area illumination, the width of the space charge zone 204 and thus the width of the structure 206s can be influenced in a targeted manner. Moreover, an electrical voltage can be applied to the bulk material 102 in order to achieve this effect. The structure 206s can be for example a through hole in the masking layer 206, such that a corresponding part of the surface of the epitaxial layer 202 is uncovered and can be treated or modified (e.g. etched, doped, etc.), for example.

Moreover, the region 206s of the masking layer 206 corresponding to the doping region 204 can only be thinner (relative to the layer thickness in the y-direction) than the rest of the masking layer 206.

Illustratively, an influencing of the masking layer 206 in the region 206s can arise which correlates with the position of the doping region 204 in relation to the area perpendicular to the y-direction. The structure 206s of the masking layer 206 can laterally overlap the doping region 204 (e.g. in relation to the x-direction or in relation to the area perpendicular to the y-direction) and be provided above (in relation to the y-direction) said doping region.

Optical structures for alignment and for overlay measurement are not required for the application of the method. Instead, in accordance with various embodiments, an electrically sensitive material is required.

In accordance with various embodiments, a wide variety of interactions with a self-assembling, self-aligning material can be implemented by means of the utilization of the space charge zone of a doping region 204. Said interactions then permit structure production which can replace the application of conventional optical lithography. In this case, the following mechanisms can be manifested, for example:

a direct structuring of the resist material that is effective in terms of process engineering, e.g. on the basis of an electroactive resist material, e.g. an electroactive polymer or an electroactive organic material;
  an indirect structuring of the resist material via a self-aligning, electrically sensitive auxiliary layer, e.g. on the basis of an electrophoretic material or an electroactive polymer; and/or
  a determination of the spatial distribution of the field strength of the electric field and the influencing of the resist material or of the auxiliary layer on the basis of this information.

When an auxiliary layer is used, it is possible to employ various mechanisms for the structuring of the resist material, such as e.g. the utilization of interference at thin layers or the use as a seed layer on which the resist material can deposit chemically. Even further mechanisms can find application here. Any suitable material can be used as resist material or as an alternative to the resist material. No restriction to a photoresist as masking layer is necessary here.

As is illustrated in FIG. 2, a buried electrically charged region 204 generates a laterally inhomogeneous electric field (as viewed perpendicular to the y-direction). The electrically charged region 204 is delimited laterally (for example in the x-direction), e.g. surrounded by bulk material or other semiconducting or nonconducting material, such that a corresponding electric field which reflects the position of the buried electrically charged region 204 arises at the surface of the epitaxial layer 202 (cf. FIG. 9A and FIG. 10A).

A structuring of the layer 206 on the basis of the information from the electric field enables a self-alignment of the layer 206 with respect to the buried electrically charged region 204.

For the layer 206 it is possible to use, for example, electroactive (or electrosensitive) materials whose properties can be influenced by the presence of an electric field, e.g. polymers can be aligned in the electric field and, for example, their solubility, layer thickness, etc. can thus be influenced. Moreover, so-called stimuli-responsive gels or smart gels can be employed. Moreover, electroresponsive particles can be mixed into a carrier gel.

The layer 206 can also be applied by means of potential-based coating methods, for example by means of an electrolytic coating, an electrophoretic coating, a cathodic electro-dip coating, an electro-polymerization, an electrochemically induced polymerization ECIP, or the like. By way of example, surface-bound hydrogels can be produced by means of electrochemically induced polymerization. In this case, the laterally inhomogeneous electric field of the buried electrically charged region 204 can locally influence the layer growth, such that the layer 206 can be structured, or grows in a structured fashion, in a manner corresponding to the buried electrically charged region 204.

FIG. 3 illustrates a schematic flow diagram of a method 300 for processing a layer, in accordance with various embodiments, cf. FIG. 4A and FIG. 4B. In this case, the method 300 includes: in 310, forming a buried electrically charged region 304 at a predefined position in a first layer 302 in such a way that the buried electrically charged region 304 generates an electric field 304f having a lateral inhomogeneous field distribution above the first layer 302; and, in 320, forming a second layer 306 above the first layer 302 using the field distribution 304f in such a way that a structure 306s of the second layer 306 correlates with the position of the buried electrically charged region 304.

FIG. 4A illustrates a layer 302 in a schematic side view or cross-sectional view after for example step 310 of the method 300 had been carried out, in accordance with various embodiments. The layer 302 can be any desired carrier that is suitable, e.g. a wafer, a layer (e.g. a base epitaxial layer), or any other support that is suitable, e.g. a coated substrate. However, the layer 302 must be dielectric or semiconducting, such that a buried region 304 can be provided in the layer 302, which buried region generates an electric field 304f at or above the surface 302a of the layer 302. The electric field 304f becomes weaker for example proceeding from the buried electrically charged region 304 along a direction perpendicular to the direction 105 (e.g. parallel to the direction 101) (illustratively, said electric field is laterally inhomogeneous), caused by the limited lateral (i.e. sideways) extent of the buried electrically charged region 304 in this direction. In accordance with various embodiments, the buried electrically charged region 304 can be completely surrounded by layer material of the first layer 302.

FIG. 4B illustrates the layer 302 in a schematic side view or cross-sectional view after for example steps 310 and 320 of the method 300 had been carried out, in accordance with various embodiments. As described herein, a second layer 306 was deposited and/or structured above the first layer 302 using the field distribution 304f in such a way that a structure 306s of the second layer 306 correlates with the position of the buried electrically charged region 304. The second layer 306 can be formed for example in such a way that the first layer 302 directly above the buried electrically charged region 304 is free of the material of the second layer 306 or covered by said material to a lesser extent. In accordance with various embodiments, the second layer 306 can only partly overlap the buried electrically charged region 304.

Illustratively, the second layer 306 has a structure 306s that correlates with the position of the buried electrically charged region 304 in the first layer 302. The region 302s of the first layer directly above the buried electrically charged region 304 (i.e. the region 302s of the first layer between the buried electrically charged region 304 and the surface 302a of the first layer 302) can be influenced locally by means of the structured second layer 306, for example. For this purpose, said region 302s can be at least partly uncovered, wherein regions 302g laterally alongside or around said region 302s can be covered by the second layer 306. Alternatively, the second layer 306 can have a region 306s in which the second layer 306 is thinned, porous, etc., such that the region 302s of the first layer can be influenced (e.g. doped) through the region 306s of the second layer 306.

FIG. 5 illustrates a schematic flow diagram of a method 500 for processing a layer, in accordance with various embodiments, cf. FIG. 6A to FIG. 6D. In this case, the method 500 includes: in 510, doping a multiplicity of first regions 304 of a semiconductor wafer 302 in such a way that a space charge zone SCZ is formed in each of the first regions 304, wherein the first regions 304 are arranged alongside one another in a predefined lateral pattern; in 520, growing a for example epitaxial semiconductor layer 502 on the semiconductor wafer 302 in such a way that the first regions 304 are covered, wherein an electric field 304f generated by the respective space charge zones SCZ and having a lateral field distribution passes through an uncovered surface 502a of the epitaxial semiconductor layer 502; in 530, forming a structured masking layer 306 above the uncovered surface 502a of the epitaxial semiconductor layer 502 using the lateral field distribution in such a way that a multiplicity of second regions 502s of the epitaxial semiconductor layer 502 are free of the masking layer 306, wherein a second region of the multiplicity of second regions 502s is in each case arranged in a laterally overlapping fashion above a respective first region of the multiplicity of first regions 304; and, in 540, doping the multiplicity of second regions 502s of the epitaxial semiconductor layer 502 using the masking layer 306.

Figure 6A:
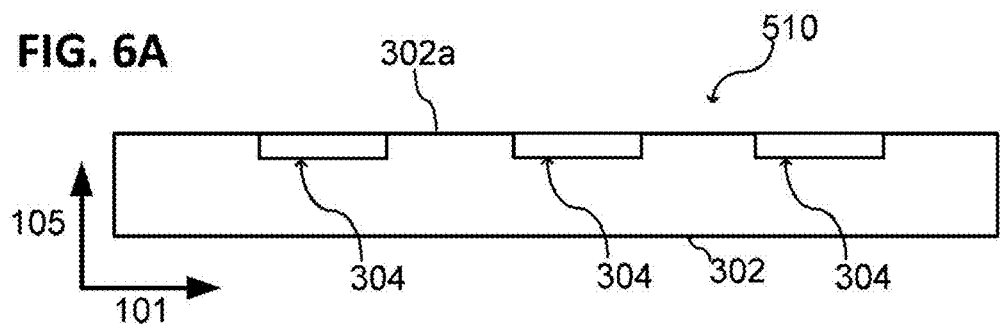
FIGS. 6A to 6D show in each case a schematic illustration of a semiconductor wafer during different process steps of a method for processing the semiconductor wafer, in accordance with various embodiments.

FIG. 6A illustrates a semiconductor wafer 302 in a schematic side view or cross-sectional view for example after step 510 of the method 500 had been carried out, in accordance with various embodiments. Instead of the semiconductor wafer 302, any suitable layer 302 can be used analogously, e.g. a base epitaxial layer 302 or any other suitable carrier 302, e.g. a single-crystal substrate 302.

A multiplicity of doped first regions 304 are formed in the semiconductor wafer 302 by means of doping. Said regions 304 can be oppositely doped with respect to the semiconductor wafer 302, i.e. form in each case a p-n junction or a space charge zone SCZ in the semiconductor wafer 302. In this case, the doped first regions 304 are arranged alongside one another in a predefined pattern. In accordance with various embodiments, said pattern forms the basis for forming a self-aligning masking layer 306.

Analogously, an electrically charged region 304 can also be formed in a dielectric or electrically nonconducting substrate 302 or in a dielectric or electrically nonconducting layer. Consequently, although a p-n junction is not necessarily produced, an electrically charged region which causes a corresponding electric field is produced in each case.

Figure 6B:
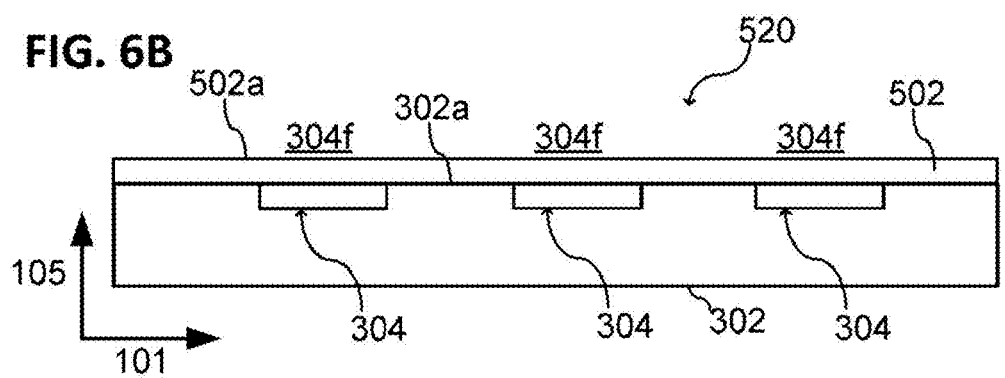

FIG. 6B illustrates a semiconductor wafer 302 in a schematic side view or cross-sectional view for example after steps 510 and 520 of the method 500 had been carried out, in accordance with various embodiments. In this case, a for example epitaxial semiconductor layer 502 is arranged on the semiconductor wafer 302. The semiconductor layer 502 is semiconducting, for example, such that the electric field 304f generated by the doped first regions 304 can penetrate through the semiconductor layer 502 (alternatively, an electrically insulating layer 502 can be used). Consequently, a self-aligning masking layer 306 can be formed on and/or above the surface 502a of the semiconductor layer 502.

Illustratively, buried electrically charged regions 304 are formed by electrically charged regions being formed at a surface 302a of a substrate (the semiconductor wafer 302 in this exemplary embodiment), e.g. by means of doping, and a cover layer (the for example epitaxial semiconductor layer 502 in this exemplary embodiment) subsequently being formed on the surface of the substrate in order to bury the electrically charged regions 304. In this case, the substrate 302 and the cover layer 502 may include the same material or consist of the same material. If the substrate and the cover layer include a semiconductor material, these can be doped identically, i.e. with the same doping type (p- or n-doped) and (optionally) also with the same doping concentration.

The epitaxial layers or other layers can be grown as usual by means of chemical or physical vapor deposition. The doping can be carried out for example thermally or by means of ion implantation.

Figure 6C:
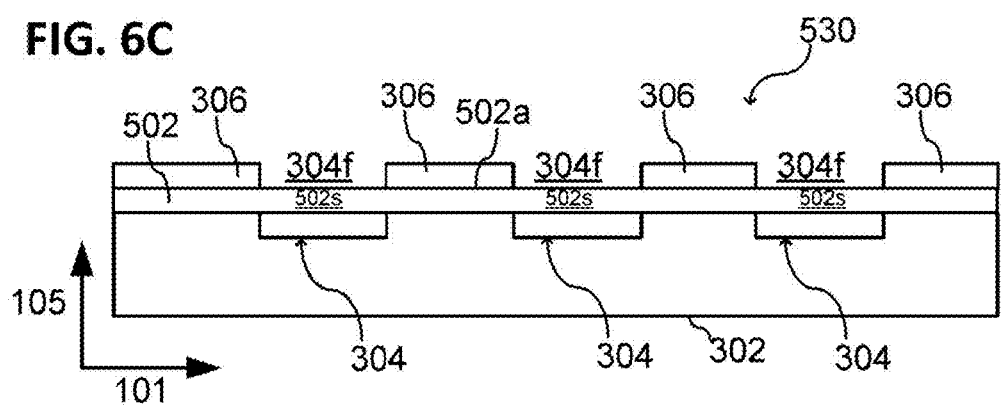

FIG. 6C illustrates a semiconductor wafer 302 in a schematic side view or cross-sectional view for example after steps 510, 520 and 530 of the method 500 had been carried out, in accordance with various embodiments. As described herein, a structured masking layer 306 can be formed above the uncovered surface 502a of the semiconductor layer 502 using the lateral field distribution generated by the doped first regions 304.

The lateral field distribution may be such that the electric field directly above (with respect to direction 105) the doped first regions 304 is the highest. Consequently, the masking layer 306 can be structured in such a way that a multiplicity of second regions 502s of the semiconductor layer 502 are free of the masking layer 306. Here a region 502s of the semiconductor layer 502 is in each case arranged in a laterally overlapping fashion above a respective region 304 of the semiconductor wafer 302. On account of the utilization of the electric field distribution for the self-alignment of the masking layer 306, the regions 304, 502s of the semiconductor wafer 302 and of the semiconductor layer 502 which are correspondingly arranged one directly above another can have a minimum overlay offset.

Figure 6D:
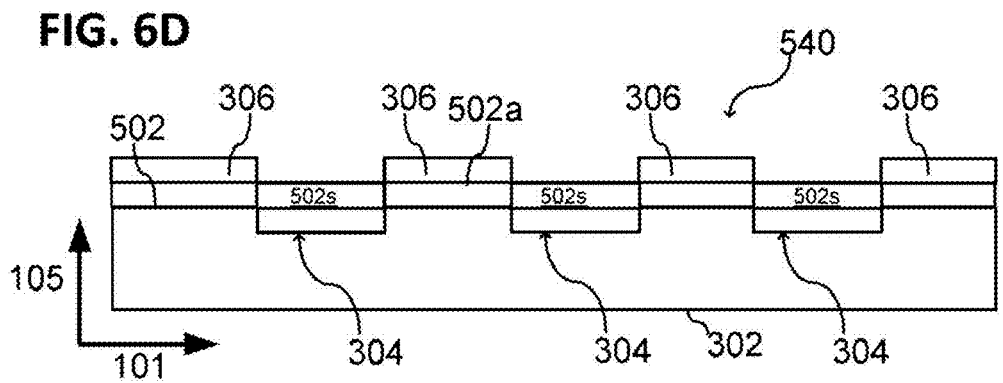

FIG. 6D illustrates a semiconductor wafer 302 in a schematic side view or cross-sectional view for example after steps 510, 520, 530 and 540 of the method 500 had been carried out, in accordance with various embodiments.

Using the structured masking layer 306, the second regions 502s of the semiconductor layer 502 can be locally treated, e.g. doped.

The epitaxial semiconductor layer 502 can for example be doped, e.g. with the same doping as the semiconductor wafer 302. Furthermore, the second regions 502s of the epitaxial semiconductor layer 502 can be doped in such a way that a p-n junction or a space charge zone arises in each case in the second regions. By way of example, the semiconductor wafer 302 and the epitaxial semiconductor layer 502 can be n-doped and the first regions 304 of the semiconductor wafer 302 and the second regions 502s of the semiconductor layer 502 can be p-doped in each case, or vice versa. Consequently, in the semiconductor layer 502 on account of the doping of the second regions 502s a space charge zone arises which in turn generates a laterally inhomogeneous electric field, which can once again be used to form a structured masking layer on the semiconductor layer 502.

The method 500 can thus furthermore include, e.g. after step 540, (e.g. completely) removing the masking layer 306 and subsequently growing a further for example epitaxial semiconductor layer analogously to step 520 of the method 500. By means of correspondingly repeating method steps 520, 530 and 540, a buried columnar doping region can thus be produced for example in each case layer by layer, cf. FIG. 1. Each of the epitaxial layers in this case can have a layer thickness in a range of approximately 0.5 µm to approximately 20 µm, e.g. in a range of approximately 1 µm to approximately 5 µm. The number of epitaxial layers can be for example greater than 3, e.g. in a range of 5 to 20.

In accordance with various embodiments, the regions 304, 502s of the semiconductor wafer 302 (or analogously of a first layer 302) and of the second layer 502 which are arranged one above another can in each case form a common doping region. The doping of the regions 304, 502s of the buried columnar doping region can be greater than approximately $1.00E+16/cm^3$, e.g. $1.00E+17/cm^3$, or in a range of approximately $1.00E+16/cm^3$ to approximately $1.00E+19/cm^3$. The doping of the carrier 302, 502 can be greater than approximately $1.00E+13/cm^3$, e.g. $1.00E+14/cm^3$ or in a range of approximately $1.00E+13/cm^3$ to approximately $1.00E+16/cm^3$.

Figure 8A:
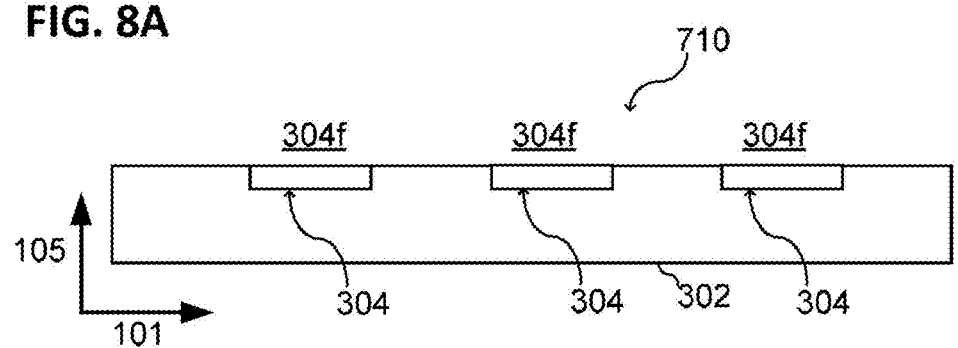
FIGS. 8A to 8C show in each case a schematic illustration of a layer during different process steps of a method for processing the layer, in accordance with various embodiments.
Figure 8B:
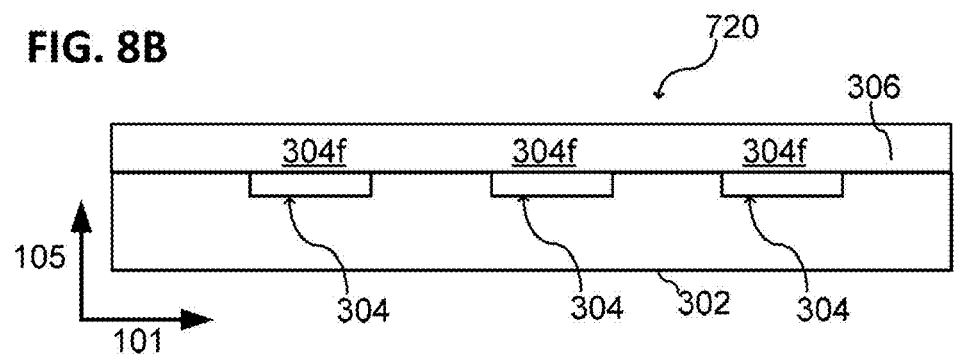
Figure 8C:
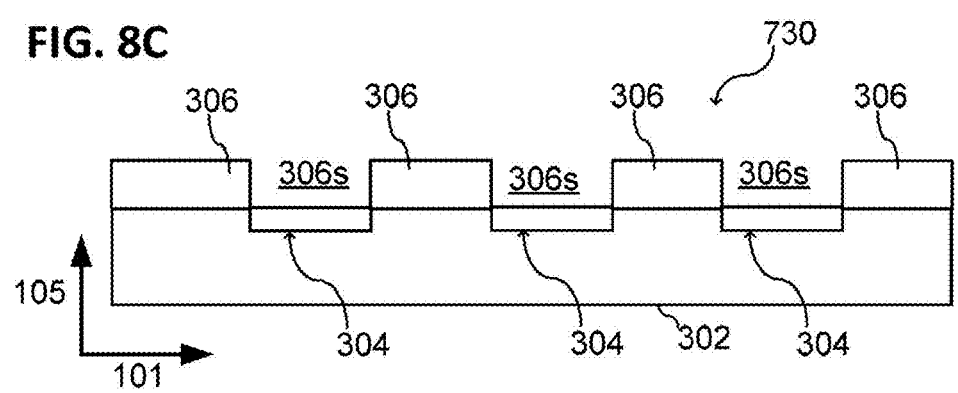

FIG. 7 illustrates a schematic flow diagram of a method 700 for producing a self-aligning masking layer, in accordance with various embodiments, cf. FIG. 8A to FIG. 8C. In this case, the method 700 includes: in 710, forming a multiplicity of electrically charged regions 304 in a predefined lateral pattern alongside one another in a first layer 302 in such a way that the electrically charged regions 304 generate an electric field 304f having a field distribution corresponding to the lateral pattern above the first layer 302; in 720, forming an electroactive layer 306 above the first layer 302, wherein the electroactive layer 306 is influenced by the electric field 304f in accordance with the lateral pattern of the field distribution; and, in 730, treating the electroactive layer 306 in such a way that the electroactive layer 306 is partly removed 306s in accordance with the lateral pattern.

Partly removing the electroactive layer 306 can be understood as structuring the electroactive layer 306. In this case, the structure 306s (e.g. a multiplicity of cutouts 306s in the electroactive layer 306) correlates with the lateral pattern (i.e. the respective positions in the area transversely with respect to the direction 105) of the electrically charged regions 304.

In accordance with various embodiments, the electric field 304f can penetrate through the electroactive layer 306 and locally influence the solubility thereof or some other property (e.g. the adhesion properties or chemical properties thereof), such that the electroactive layer 306 can be partly removed.

The structured electroactive layer 306 can itself be used as masking layer or be utilized to produce a structured masking layer. By way of example, the structured electroactive layer 306 can function as a seed layer for a coating process or as a lift-off layer for a lift-off process. Furthermore, the structured electroactive layer 306 can be used as an optical interference layer or mirror layer in order to influence the exposure of an overlying photoresist layer. Said photoresist layer can then be irradiated homogeneously, for example, wherein the pattern in the photoresist layer is formed by the underlying structured electroactive layer 306.

It goes without saying that aspects of the various embodiments described herein can in each case be similarly transferred to one another or combined with one another. Generally, various possibilities arise for using the information of the electric field generated by buried electrically charged regions for structuring a masking layer.

The information of the electric field can also be utilized actively, e.g. be determined by means of a measuring method, whereupon it is possible actively to intervene in a structuring process for a masking layer. By way of example, it is possible to influence the growth of a masking layer locally by means of a laser or the like on the basis of the information determined. Furthermore, it is also possible to influence the partial removal of a masking layer locally by means of a laser or the like on the basis of the information determined.

A description is given hereinafter, by way of example, of two different measuring methods by means of which the electric field can be measured and by means of which the (for example lateral) field distribution of the electric field can be determined.

Figure 9A:
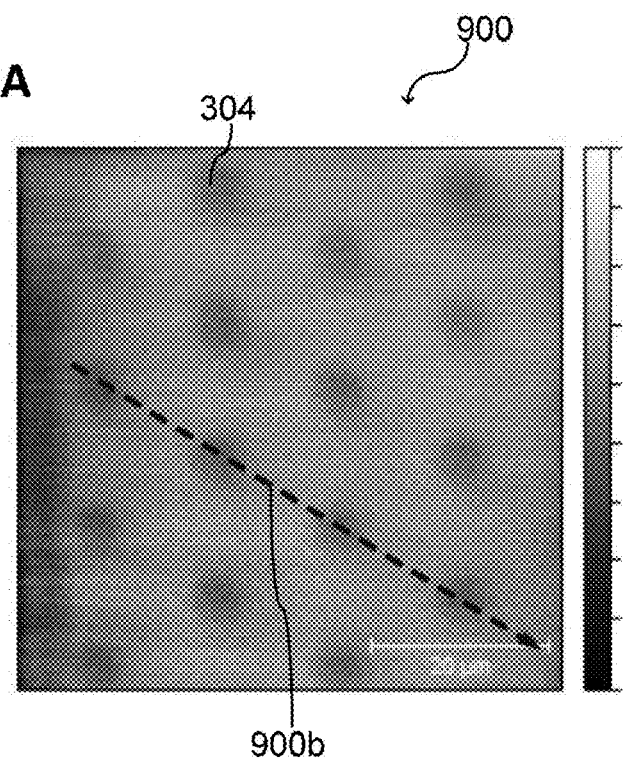
FIGS. 9A and 9B show a method for determining the spatial distribution of the electric field above a layer with buried electrically charged regions, in accordance with various embodiments.

FIG. 9A shows, by way of example, an imaging of a surface of a layer, wherein electrically charged regions 304 are buried in the layer, as described herein in accordance with various embodiments. The imaging was created by means of so-called scanning spreading resistance microscopy (SSRM). SSRM is a modified form of atomic/scanning force microscopy (AFM, SFM), the measuring apparatuses required therefor being commercially available.

The buried electrically charged regions 304 are shown dark and correspond to a changed measuring resistance (spreading resistance).

Figure 9B:
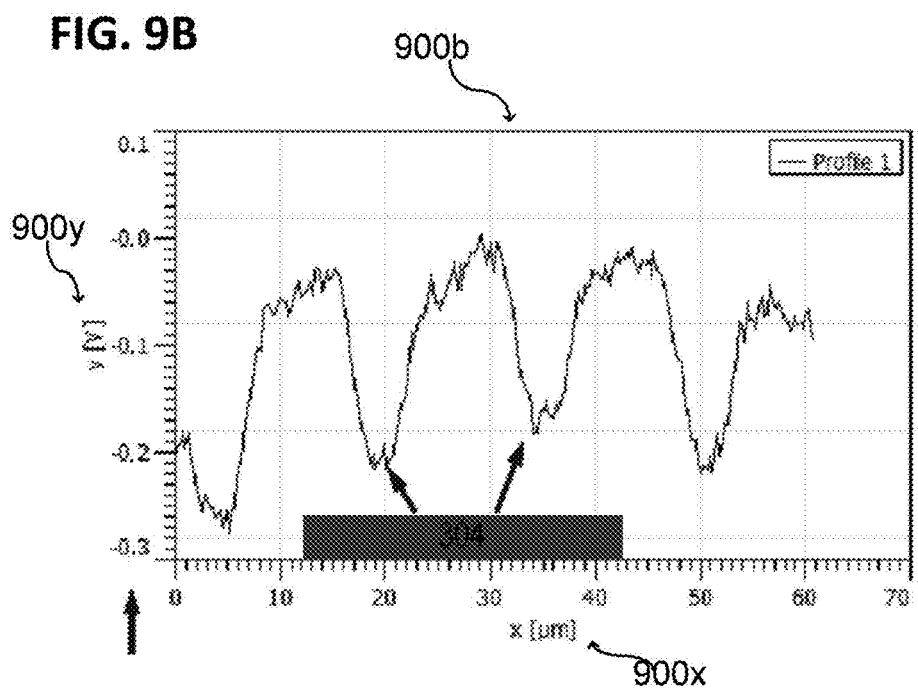

FIG. 9B illustrates a line scan 900b of the measuring resistance 900y along the X-direction 900x. The positions of the buried electrically charged regions 304 can be determined on the basis of such measurements. It is also evident that a layer can be influenced locally differently on account of the electric field.

Figure 10A:
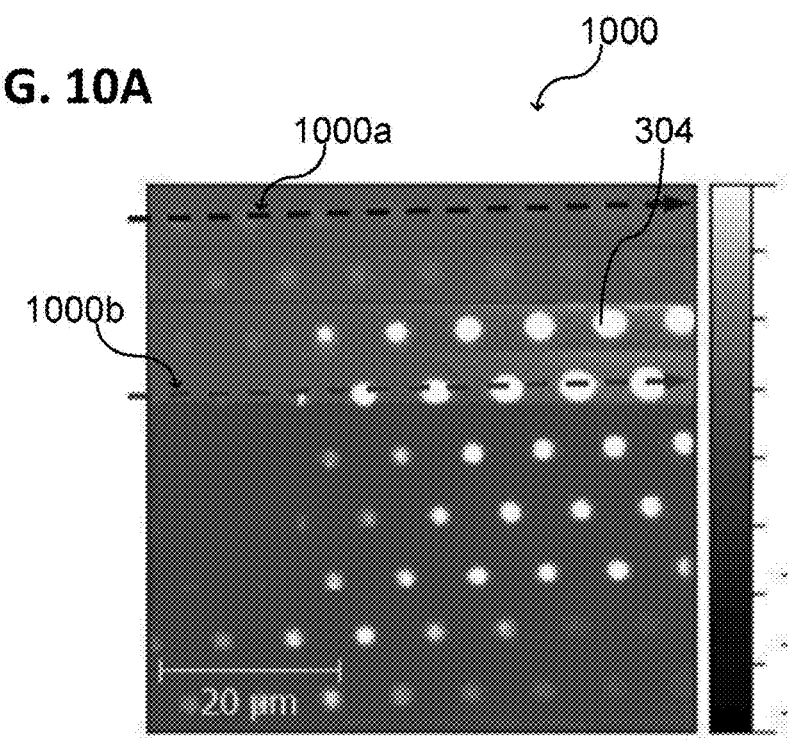
FIGS. 10A and 10B show a method for determining the spatial distribution of the electric field above a layer with buried electrically charged regions, in accordance with various embodiments.

FIG. 10A shows, by way of example, an imaging of a surface of a layer, wherein electrically charged regions 304 are buried in the layer, as described herein in accordance with various embodiments. The imaging was created by means of so-called scanning voltage microscopy (SVM). SVM is a modified form of atomic/scanning force microscopy, the measuring apparatuses required therefor being commercially available.

The buried electrically charged regions 304 are shown bright and correspond to a high measurement voltage.

Figure 10B:
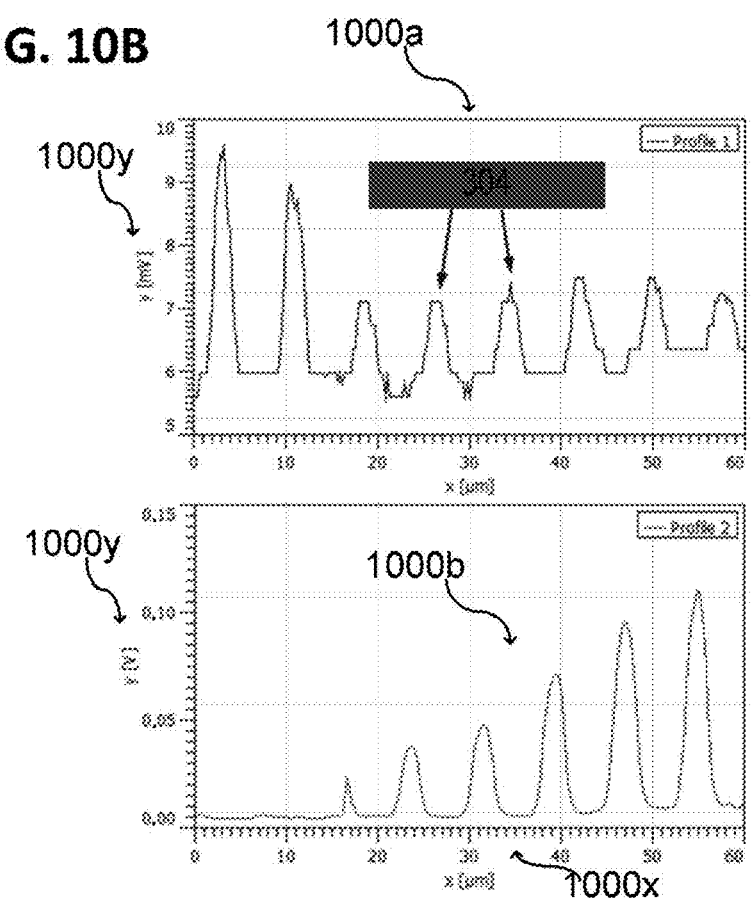

FIG. 10B illustrates two line scans 1000a, 1000b of the respective measurement voltage 1000y along the X-direction 1000x. The positions of the buried electrically charged regions 304 can be determined on the basis of such measurements. It is also evident that a layer can be influenced locally differently on account of the electric field.

With both methods presented above it is possible to measure the buried electrically charged regions 304, e.g. p-type regions in an n-doped layer or n-type regions in a p-doped layer, wherein the electrically charged regions 304 are buried more deeply than 500 nm or 1 µm.

In order to determine the electric field distribution, it is also possible to utilize other suitable methods, e.g. so-called scanning capacitance microscopy (SCM), scanning probe microscopy, or scanning tunneling microscopy.

In accordance with various embodiments, methods for producing resist structures (or a structured masking layer) are provided, proceeding from and self-aligning with respect to buried doping regions already present, without the use of photolithography.

As electroactive material it is possible to use for example a chemical precursor in a CVD method, wherein the chemical precursor reacts sensitively to the electric field. By way of example, electroactive/electrosensitive polymers can be used.

A buried doping region can also influence a resist or the like, such that a structure forms in the resist in accordance with the buried doping region present.

In accordance with various embodiments, a device may include the following: a buried electrically charged region at a predefined position in a first layer, wherein the buried electrically charged region is configured in such a way that it generates an electric field having a lateral inhomogeneous field distribution above the first layer; and a (e.g. structured) second layer above the first layer, wherein the second layer includes an electroactive material. The device can be designed analogously to the methods described herein. The device can be for example part of a semiconductor component.

In accordance with various embodiments, a method for producing a self-aligning masking layer may include the following: forming a multiplicity of electrically charged regions in a predefined lateral pattern alongside one another in a first layer in such a way that the electrically charged regions generate an electric field having a field distribution corresponding to the lateral pattern above the first layer, forming a structured electroactive layer above the first layer, wherein the structured electroactive layer is formed in accordance with the lateral pattern of the field distribution of the electric field.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method, comprising:
   forming a buried electrically charged region at a predefined position in a first layer in such a way that the buried electrically charged region generates an electric field having a lateral inhomogeneous field distribution above the first layer; and
   forming a second layer comprising electroactive material above the first layer using the field distribution in such a way that a structure of the second layer correlates with the position of the buried electrically charged region, wherein the second layer reacts to the electric field of the buried electrically charged region so as to undergo self-assembly so as to form a structured layer.

2. The method of claim 1,
   wherein the first layer comprises an electrically insulating material or consists thereof.

3. The method of claim 2,
   wherein forming the buried electrically charged region comprises doping the first layer;
   wherein the buried electrically charged region is a doped region of the first layer.

4. The method of claim 3,
   wherein forming the buried electrically charged region comprises forming a space charge zone in such a way that the space charge zone defines the buried electrically charged region.

5. The method of claim 4, further comprising:
   irradiating the first layer with electromagnetic radiation, at least one of heating the first layer or applying an electrical voltage to the first layer in such a way that the field strength of the electric field generated by the space charge zone is increased.

6. The method of claim 1,
   wherein the first layer comprises an electrically semiconducting material or consists thereof.

7. The method of claim 1,
   wherein forming the buried electrically charged region comprises forming the electrically charged region at a surface of a substrate and subsequently applying a cover layer on the surface of the substrate in order to bury the electrically charged region.

8. The method of claim 7,
   wherein the substrate is a silicon wafer; and
   wherein the cover layer is an epitaxial silicon layer.

9. The method of claim 1,
   wherein forming the second layer comprises applying dielectric particles in a structured fashion;
   wherein the dielectric particles partly adhere to the first layer on account of the electric field.

10. The method of claim 1,
    wherein forming the second layer is carried out in such a way that the second layer masks the first layer;
    wherein a region of the first layer above the buried electrically charged region is free of the second layer.

11. The method of claim 10, further comprising:
    doping the region of the first layer above the buried electrically charged region by using the second layer as masking layer.

12. The method of claim 1, further comprising:
    forming a masking layer by using the second layer in such a way that the masking layer masks the first layer;
    wherein a region of the first layer above the buried electrically charged region is free of the masking layer.

13. The method of claim 12, further comprising:
    doping that region of the first layer which is arranged above the buried electrically charged region by using the masking layer.

14. The method of claim 1, wherein the structured layer comprises at least one through hole.

15. A method, comprising:
    forming a buried electrically charged region at a predefined position in a first layer in such a way that the buried electrically charged region generates an electric field having a lateral inhomogeneous field distribution above the first layer; and
    forming a second layer above the first layer based on and using the field distribution in such a way that a structure of the second layer correlates with the position of the buried electrically charged region,
    wherein forming the second layer comprises:
       determining the laterally inhomogeneous field distribution of the electric field; and
       forming the second layer using the determined field distribution.

16. The method of claim 15,
    wherein forming the second layer comprises laser-assisted deposition using the determined field distribution.

* * * * *